United States Patent [19]

Ohno et al.

[11] Patent Number: 4,803,524

[45] Date of Patent: Feb. 7, 1989

[54] METHOD OF AND APPARATUS FOR DETECTING THE ACCURACY OF SUPERPOSITION EXPOSURE IN AN EXPOSURE APPARATUS

[75] Inventors: Koichi Ohno, Kanagawa; Kenji Higashi, Saitama; Hiroki Tateno, Tokyo, all of Japan

[73] Assignee: Nikon Corporation, Tokyo, Japan

[21] Appl. No.: 60,021

[22] Filed: Jun. 9, 1987

Related U.S. Application Data

[63] Continuation-in-part of Ser. No. 889,785, Jul. 28, 1986, abandoned.

[30] Foreign Application Priority Data

Aug. 3, 1985 [JP] Japan .................................. 60-171419
Jun. 9, 1986 [JP] Japan .................................. 61-131902

[51] Int. Cl.⁴ .............................................. G03B 27/42
[52] U.S. Cl. ........................................ 355/53; 355/77; 356/401
[58] Field of Search ......................... 355/43, 45, 53, 77, 355/86; 356/400, 401

[56] References Cited

U.S. PATENT DOCUMENTS

| | | | |
|---|---|---|---|
| 4,052,603 | 10/1977 | Karlson | 355/86 X |
| 4,385,838 | 5/1983 | Nakazawa et al. | 356/401 X |
| 4,627,010 | 12/1986 | Kosugi | 356/401 X |
| 4,629,313 | 12/1986 | Tanimoto | 355/53 |

*Primary Examiner*—Richard A. Wintercorn
*Attorney, Agent, or Firm*—Shapiro and Shapiro

[57] ABSTRACT

An apparatus having stage means on which a substrate is placed, holding means for holding a mask formed with at least one mark, and exposing means for exposing the image of said at least one mark on the exposure surface of the substrate which is coated with photoresist includes displacing means for imparting relative displacement between the stage means and the holding means, control means for controlling the exposing means and the displacing means and executing first exposure and second exposure successively, the control means executing the first and the second exposure of exposing the image of said at least one mark on a plurality of predetermined areas of the exposure surface of the substrate placed on the stage means, and controlling the exposing means and the displacing means so that the amount of deviation between the position of the image of said at least one mark in each of the predetermined areas during the first exposure and the position of said image during the second exposure assumes a predetermined value, developing means for developing the substrate in response to the termination of the second exposure, deviation amount detecting means for detecting the amount of deviation between the position of the image of said at least one mark in each of the predetermined areas of the developed substrate during the first exposure and the position of said image during the second exposure and making a detection signal, and determining means for determining the accuracy of the apparatus in accordance with the detection signal and the predetermined value.

21 Claims, 9 Drawing Sheets

FIG. 3A
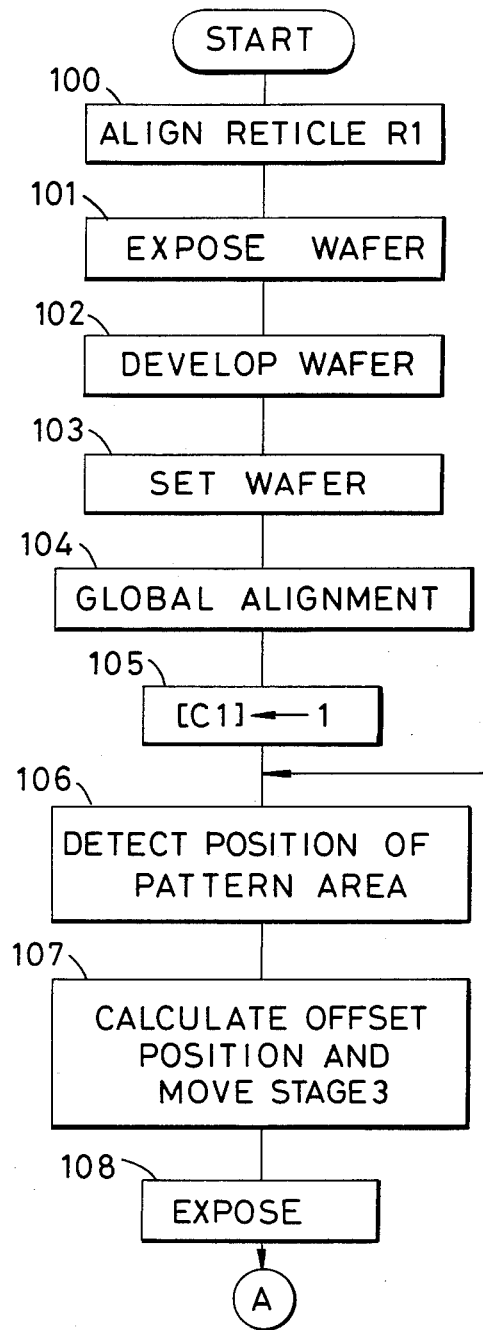
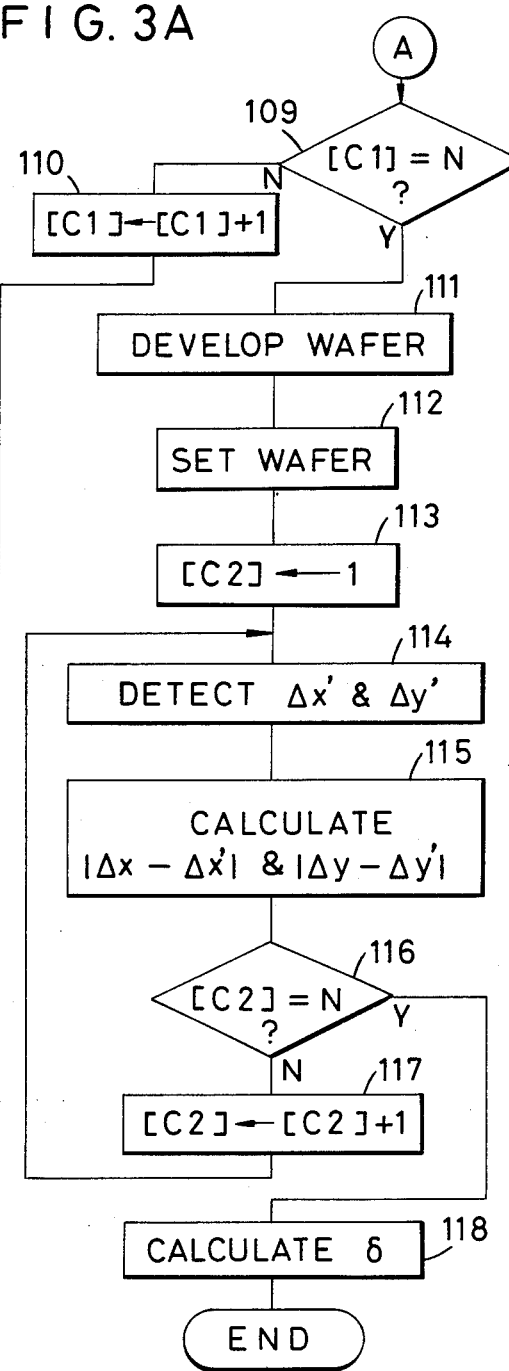

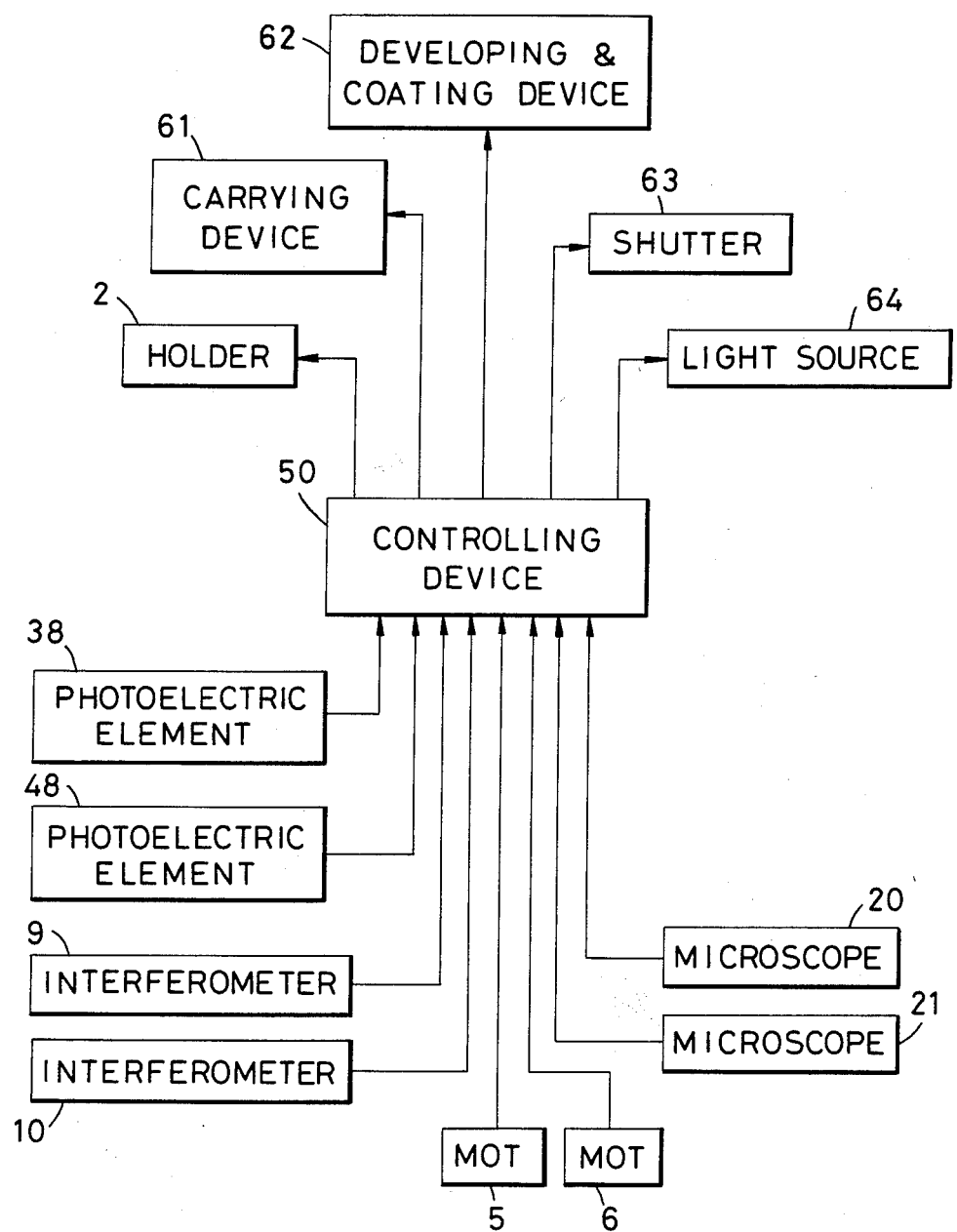

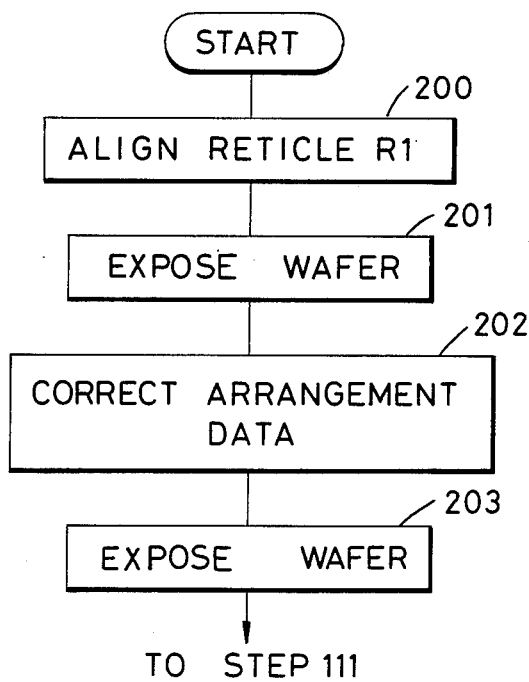

METHOD OF AND APPARATUS FOR DETECTING THE ACCURACY OF SUPERPOSITION EXPOSURE IN AN EXPOSURE APPARATUS

This is a continuation-in-part applicaiton of Ser. No. 889,785 filed July 28, 1986, now abandoned.

BACKGROUND OF THE INVENTION

1. Field of the Invention

This invention relates to a method of and an apparatus for detecting the alignment accuracy in an exposure apparatus for transferring the pattern image of a mask, a reticle or the like onto a photosensitive substrate.

2. Related Background Art

In recent years, numerous reduction projection type-exposure apparatuses have been used in the manufacturing line of super-LSI. The role of an exposure apparatus is to make a resist pattern of predetermined line width at a predetermined location on a photosensitive substrate such as a silicon wafer or a glass substrate. To achieve such role, an alignment technique of high accuracy and a reduction projection lens of high resolution are required. In the case of the exposure apparatus, the element concerned with the alignment can be broadly divided into the alignment of the image of a reticle on which a circuit pattern is formed relative to the coordinate system in the exposure field of a projection optical system and the alignment of the exposed image relative to the coordinate system concerned with the arrangement of a plurality of chips formed on a wafer by the feeding mechanism of a wafer stage on which the wafer is placed and an alignment system. The error of the alignment of the image relative to the coordinate system in the exposure field is attributable to the magnification error of the projection optical system, the distortion of the optical system and the rotation error of the reticle mounted on a reticle holder. Also, the error of the alignment relative to the coordinate system concerned with the arrangement of the chips is attributable to the stepping error of the stage, the alignment error, the rotation error of the wafer stage, etc., and further, where global alignment of the wafer is effected, it also includes the scaling error of the stage the error of orthogonality, the error of straightness, etc. Any of these alignment errors may be a cause which reduces the accuracy of the superposition exposure for forming a plurality of layers on the wafer while superposing them upon one another. So, heretofore, in order to examine the superposition accuracy of the exposure apparatus, two reticles having actual circuit patterns or reference marks have been used to effect superposition exposure on a wafer for trial printing and that wafer has been developed, whereafter the resist pattern remaining on the wafer has been measured by the use of a separate examining device of high accuracy, whereby the superposition accuracy has been found. In this case, the use of the examining device of high accuracy is requisite. Such an examining device is expensive and, unlike a manufacturing apparatus such as a stepper, it is not operated at all times. However, where a semiconductive element manufacturing line using a stepper is to be made, an examining device belonging to the line is necessary, and this has meant a high cost. Further, where the accuracy during superposition exposure is to be controlled on the basis of the superposition error measured by the examining device, the work has been very cumbersome and not only the accuracy of the exposure apparatus but also the accuracy of the examining device had to be controlled.

Furthermore, two reticles have been required during the superposition exposure by trial printing, and the arrangement error between the patterns formed on the two reticles, the error of the line width thereof and the reticle alignment error accompanying the replacement of the reticles have been included in the superposition accuracy, and this has also led to a disadvantage that the original superposition accuracy of the exposure apparatus cannot be accurately examined.

SUMMARY OF THE INVENTION

It is an object of the present invention to provide a method of and an apparatus for easily detecting the superposition accuracy in an exposure apparatus.

To achieve the above object, the apparatus of the present invention is designed to execute a first exposure and a second exposure in which a light transmitted through a mask held by holding means is exposed on a predetermined area of the exposure surface of a substrate placed on stage means, control the second exposure so that the amount of deviation between the position of said transmitted light in said predetermined area during the first exposure and the position of said transmitted light during the second exposure assumes a predetermined value, and detect, after the termination of the first and the second exposure, the amount of deviation between the position of said transmitted light in said predetermined area during the first exposure and the position of said transmitted light during the second exposure, and thereby detect the superposition accuracy, etc. of the apparatus.

BRIEF DESCRIPTION OF THE DRAWINGS

FIG. 3A is a flow chart showing the operation of an embodiment of the present invention.

FIG. 4 is a block diagram showing a part of the construction of an embodiment of the present invention.

FIG. 5 is a flow chart showing the operation of another embodiment of the present invention.

DESCRIPTION OF THE PREFERRED EMBODIMENTS

Figure 1:
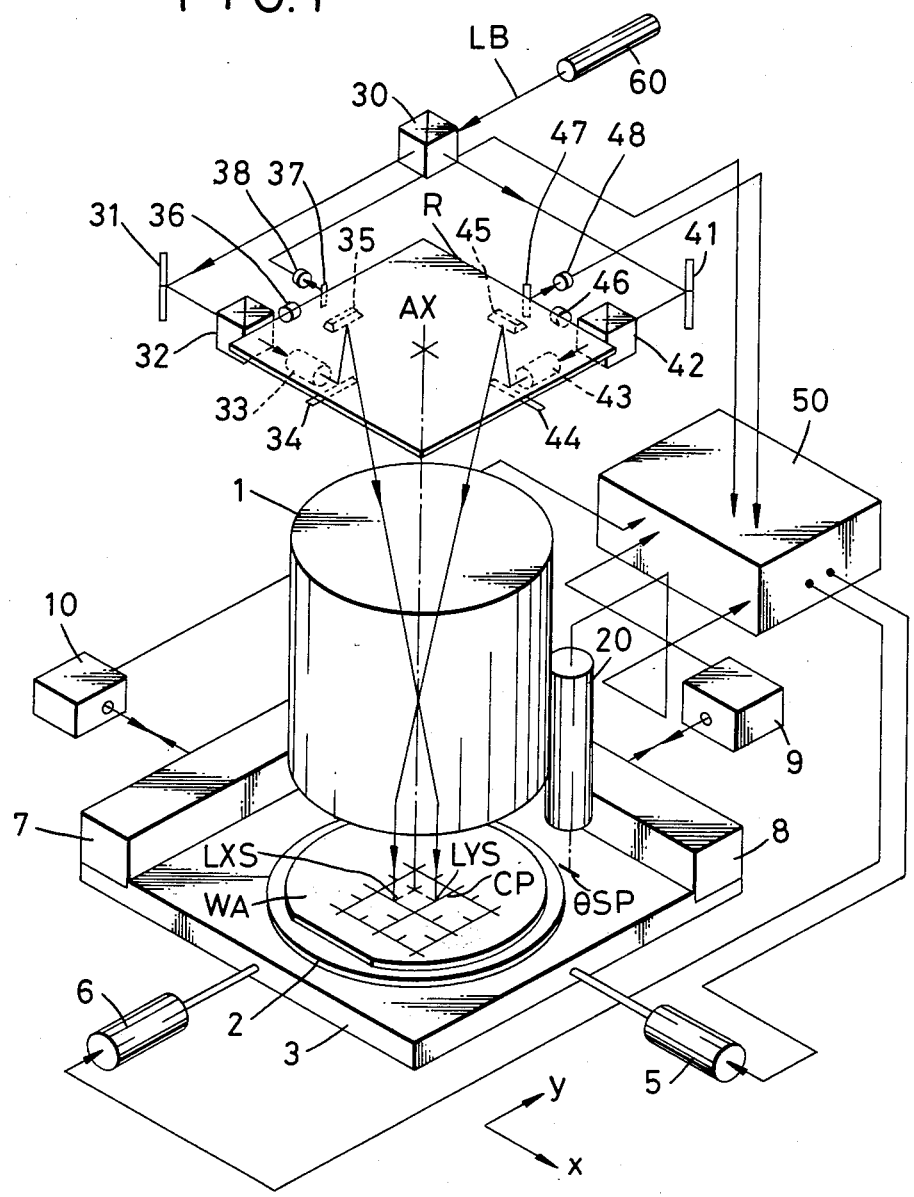
FIG. 1 is a perspective view of a reduction projection type exposure apparatus according to an embodiment of the present invention.

In FIG. 1, a reticle R which provides a projection negative is mounted on a reticle holder with the center of projection thereof positioned so as to pass through the optic axis of a projection lens 1. The projection lens 1 projects a circuit pattern image depicted on the reticle R onto a wafer WA while reducing it. A wafer holder 2 vacuum-adsorbs the wafer WA and is provided for minute rotation relative to a stage 3 movable two-dimensionally in x direction and y direction. The movement of the stage 3 in x direction is accomplished by the drive of a motor 5 and the movement of the stage 3 in y direction is accomplished by the drive of a motor 6. A reflecting mirror 7 whose reflecting flat surface extends in y direction and a reflecting mirror 8 whose reflecting flat surface extends in x direction are secured to two orthogonal two side edges, respectively, of the stage 3. A laser light wave interference measuring machine (hereinafter simply referred to as the laser interferometer) 9 projects laser light onto the reflecting mirror 8 and detects the position (or the amount of movement) of the stage 3 in y direction, and a laser interferometer 10 projects laser light onto the reflecting mirror 7 and detects the position (or the amount of movement) of the stage 3 in x direction. Provided sideways of the projection lens 1 are off-axis type wafer alignment microscopes (hereinafter referred to as WAMs) 20 and 21 for detecting or observing an alignment mark on the wafer WA. In FIG. 1, the WAM 21 is behind the projection lens 1 and is not shown. The WAMs 20 and 21 have their respective optic axes parallel to the optic axis AX of the projection lens 1, and image band-like laser light spots YSP and $\theta$SP extending elongatedly in x direction on a plane substantially conincident with the exposed surface of the wafer WA placed on the wafer holder 2. (The light spot YSP is not shown in FIG. 1.) These light spots YSP and $\theta$SP are light of a wavelength which does not sensitize the photoresist on the wafer WA, and in the present embodiment, they are vibrating in y direction with a minute amplitude. Each of the WAMs 20 and 21 has a photoelectric element for receiving the scattered light or the diffracted light from a mark and a circuit for synchronously rectifying the photoelectric signal thereof at the vibration period of the light spots, and puts out an alignment signal corresponding to the deviation of the mark in y direction relative to the centers of vibration of the light spots $\theta$SP and YSP in y direction. Accordingly, the WAMs 20 and 21 are of a structure equal to a so-called light spot vibration scanning type photoelectric microscope.

Now, in the present apparatus, there is provided a laser step alignment (hereinafter referred to as LSA) optical system for detecting a mark on the wafer WA through the projection lens 1. A laser beam LB produced by a laser light source 60 including an expander, a cylindrical lens, etc. is light of a wavelength which does not sensitize photoresist, and enters a beam splitter 30 and is divided into two light beams thereby. The transverse cross-section of the laser beam LB is made band-like by the cylindrical lens contained in the laser light source 60. One of the divided laser beams is reflected by a mirror 31, passes through a beam splitter 32 and is converged by an imaging lens group 33, whereafter it enters a first turn-back mirror 34 disposed between the reticle R and the projection lens 1 so as not to intercept the projection optical path of the circuit pattern. The first turn-back mirror 34 reflects the laser beam upwardly toward the reticle R. The laser beam enters a mirror 35 provided below the reticle R and having a reflecting flat surface parallel to the surface of the reticle R, and is reflected thereby toward the center of the entrance pupil of the projection lens 1. The laser beam from the mirror 35 is converged by the projection lens 1 and imaged as a band-like light spot LYS extending elongatedly in x direction on the wafer WA. The light spot LYS is used to scan a diffraction grating-like mark extending in x direction on the wafer WA relatively in y direction and detect the position of that mark. When the light spot LYS irradiates the mark, diffracted light is produced from the mark. The light information again returns to the projection lens 1, the mirror 35, the mirror 34, the imaging lens group 33 and the beam splitter 32, and is reflected by the beam splitter 32 and enters an optical element 36 comprising a condensing lens and a space filter. This optical element 36 transmits therethrough the diffracted light (the 1st-order diffracted light and the 2nd-order diffracted light) from the mark, intercepts regularly reflected light (the 0-order light) and condenses the diffracted light on the light-receiving surface of a photoelectric element 38 through a mirror 37. The photoelectric element 38 puts out a photoelectric signal corresponding to the quantity of the diffracted light condensed. The mirror 31, the beam splitter 32, the imaging lens group 33, the mirrors 34, 35, the optical element 36, the mirror 37 and the photoelectric element 38 together constitute a through-the-lens type alignment optical system (hereinafter referred to as the Y-LSA system) for detecting the position of the mark on the wafer WA in y direction.

On the other hand, the other laser beam divided by the beam splitter 30 enters a through-the-lens type alignment optical system (hereinafter referred to as the X-LSA system) for detecting the position of the mark on the wafer in x direction. The X-LSA system, just like the Y-LSA system, is constituted by a mirror 41, a beam splitter 42, an imaging lens group 43, mirrors 44, 45, an optical element 46, a mirror 47 and a photoelectric element 48, and images a band-like light spot LXS extending elongatedly in y direction on the wafer WA.

A main control device 50 receives as inputs the photoelectric signals from the photoelectric elements 38 and 48, the alignment signals from the WAMs 20 and 21 and the positional information from the laser interferometers 9 and 10, and effects various operation processes for alignment and puts out instructions for driving the motors 5 and 6. This main control device 50 is provided with an operation processing unit such as a microcomputer or a minicomputer, and the operation processing unit includes therein software for apparatus control for measuring the superposition accuracy (the alignment accuracy), software for calculating the accuracy, etc.

The mark position detection by the LSA system is a known technique, and is accomplished by sampling the photoelectric signals from the photoelectric elements 38 and 48 which correspond to the intensities of the diffracted light by measuring pulses put out from the laser interferometers 9 and 10 for each unit movement (e.g. 0.02 $\mu$m) of the stage 3, and successively memorizing the sampled values (the intensities of light) in the internal memory of the control device 50. The position of the center of the mark is detected, by operation, from the data of the intensity distribution wave form of the diffracted light introduced into the internal memory. In this detection system, it is not necessary to position and stop the stage 3 so that the light spot LYS and LXS are coincident with the mark, but the stage 3 may simply be moved so that the mark is only once scanned relatively by the light spot LYS and LXS, whereby the position of the mark (the position of the stage 3 when the light spots are coincident with the mark) can be detected.

Figure 2:
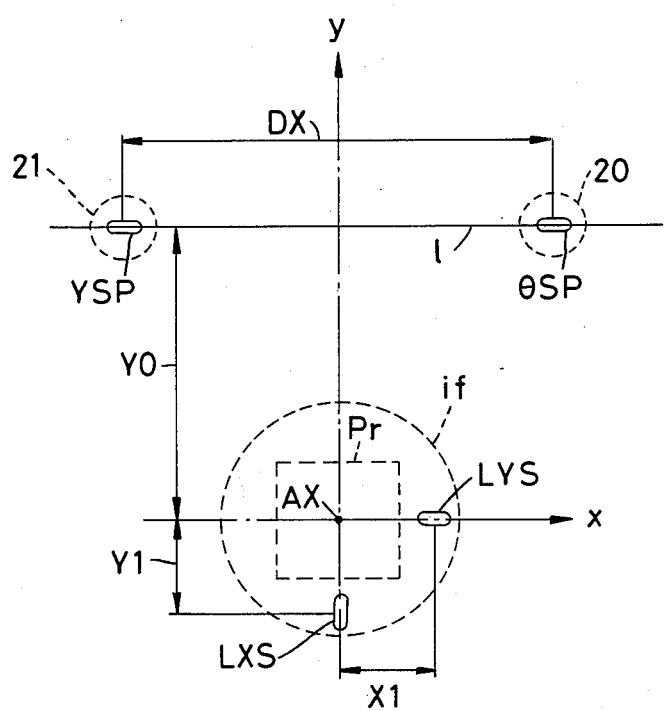
FIG. 2 is a plan view showing the arrangement of a plurality of light spot for alignment on a projection imaging plane in an embodiment of the present invention.

FIG. 2 is a plan view showing the arrangement relation on the imaging plane of the projection lens 1 (identical to the surface of the wafer WA) between the light spots $\theta$SP, YSP, LYS and LXS by the WAMs 20, 21 and the Y-LSA system and the X-LSA system. In FIG. 2, when the coordinate system xy with the optic axis AX as the origin is determined, the x-axis and the y-axis represent the directions of movement of the stage 3. In FIG. 2, the circular area about the optic axis AX is an image field if, and the rectangular area inside thereof is the projected image Pr of the effective pattern area of the reticle R. The effective pattern area is an area in which the pattern of a circuit is formed. The light spot LYS is formed at a position within the image field if and outside the projected image Pr so as to be coincident with the x-axis, and the spot light LXS is also formed at a position within the image field if and outside the projected image Pr so as to be coincident with the y-axis. On the other hand, the centers of vibration of the two light spots $\theta$SP and YSP are determined so as to be coincident with a segment (parallel to the x-axis) l spaced apart from the x-axis by a distance Yo in y direction and so that the x direction spacing Dx therebetween is of a smaller value than the diameter of the wafer WA. In the present apparatus, the light spots $\theta$SP and YSP are disposed symmetrically with respect to the y-axis, and the main control device 50 memorizes therein the information regarding the positions of the lights spot $\theta$SP and YSP relative to the projected point of the optic axis AX. The main control device 50 also memorizes therein the information regarding the central position of the light spot LYS in x direction (distance Xl) relative to the projected point of the optic axis AX and the central position of the light spot LXS in y direction (distance Y1).

These pieces of position information provide a reference value for controlling the position of movement of the stage 3 during the examination of the superposition accuracy.

Figure 3B:
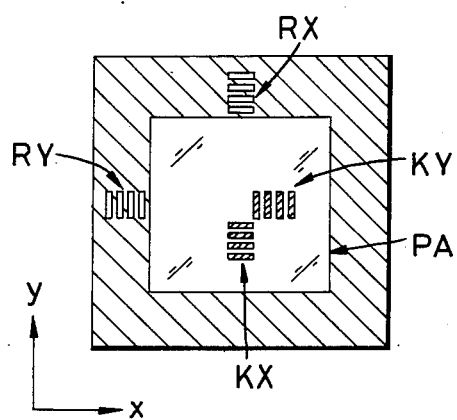
FIG. 3B shows a reticle according to an embodiment of the present invention.

Reference is now had to FIG. 3A to describe a method of checking the superposition accuracy of the apparatus of FIG. 1 by the use of that apparatus. Prior to the examination, a reticle R1 for the detection of accuracy as shown in FIG. 3B is prepared. When the coordinate system xy is determined with the center of the effective pattern area PA of the reticle R1 as the origin, diffraction grating marks RY and RX that are projected onto and exposed on the wafer WA are formed on the x-axis and the y-axis, respectively, around the pattern area PA. Each of the marks RX and RY is comprised of a plurality of slit-like transmitting areas formed in a light-intercepting member indicated by hatching. Further, in the pattern area PA, diffraction grating marks KY and KX are likewise-formed on the x-axis and the y-axis, respectively. Each of the marks KY and KX is comprised of a plurality of slit-like light intercepting areas formed in the light transmitting area. The diffraction grating marks KY and KX are of just the same shape and dimensions as the marks RY and RX. Such a reticle R1 is mounted on the reticle holder of a stepper at step 100, and the positioning of the reticle R1 is effected by the use of a reticle alignment sensor so that the optic axis AX of the projection lens 1 passes through the center of the pattern area PA.

Figure 3C:
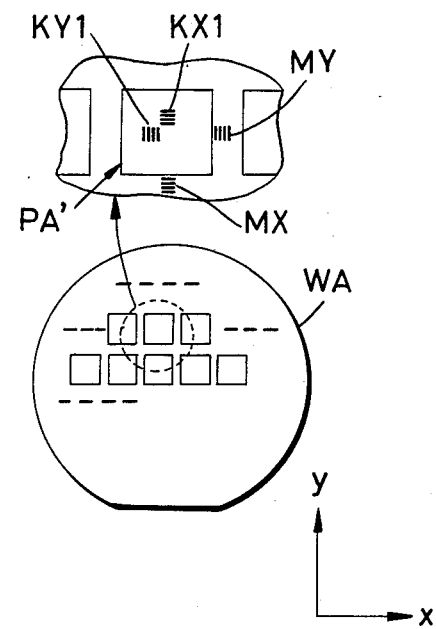
FIGS. 3C and 3D show a wafer according to an embodiment of the present invention.
Figure 3D:
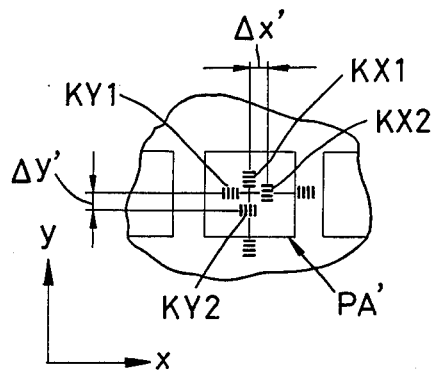

Subsequently, the wafer WA comprising bare silicon or the like having the surface thereof coated with photoresist is vacuum-adsorbed to a predetermined position on the wafer holder 2, and at step 101, the motors 5 and 6 and a shutter 63 and a light source 64 shown in FIG. 4 are driven by a step and repeat system, and the images of the pattern area PA (the marks KY and KX) and the marks RY and RX of the reticle R1 are exposed on a plurality of predetermined areas on the wafer WA. This operation is called the first print. At step 102, the wafer WA is carried from the holder 2 to a developing and coating device 62 by a carrying device 61 shown in FIG. 4, and is developed by the device 62. A plurality of pattern areas of the resist pattern corresponding to the pattern area PA are formed in the form of a matrix on the wafer WA. Enlarging one area PA' of the plurality of areas arranged in the form of a matrix, as shown in FIG. 3C, diffraction grating marks MX and MY (the transferred images of the marks RX and RY) consisting of an aggregation of minute unevenness of the resist pattern are formed around the area PA', and diffraction grating marks $KX_1$ and $KY_1$ (the transferred images of marks KX and KY) consisting of an aggregation of minute unevenness of the resist pattern are formed within the area PA'. It is because the projection optical system is used that the mark arrangement on the wafer WA is horizontally and vertically inverted relative to the mark arrangement on the reticle R1.

Subsequently, at step 103, the wafer WA is again coated with photoresist by the device 62 and is set at a predetermined position on the wafer holder 2 of the stepper by the carrying device 61. At step 104, alignment called global alignment is effected in which the position of the stage 3 in x and y directions and the rotated position of the holder 2 are adjusted so that marks MY which are formed at two spaced apart locations on the wafer WA and are in a predetermined positional relation are detected by the WAMs 20 and 21, respectively.

Subsequently, step and repeat type superposition exposure is effected, but the reticle R1 is left mounted on the stepper in the state of steps 100 and 101. Assuming that the number of areas exposed on the wafer WA is N, the control device 50 sets the content of the internal counter C to 1 at step 105. At step 106, the position in the xy coordinates of a pattern area on the wafer WA indicated by the content of the internal counter C is detected. Since the content $[C_1]$ of the internal counter C is 1, the position of the first pattern area PA' is detected. That is, the light spot LXS by the X-LSA system and the mark MX are scanned relative to each other in x direction and the position Ax of the stage 3 in x direction when the light spot LXS and the mark MX coincide with each other is detected, and subsequently the light spot LYS by the Y-LSA system and the mark MY are scanned relative to each other in y direction and the position Ay of the stage 3 in y direction when the light spot LYS and the mark MY coincide with each other is detected. These detected positions Ax and Ay are memorized in the internal memory of the main control device 50.

Next, as shown at step 107, the offset position (Ax+$\Delta$x, Ay+$\Delta$y) in which the stage 3 has been shifted relative to the detected positions Ax, Ay by $\Delta$x (e.g. $-20$ $\mu$m) in x direction and by $\Delta$y (e.g. $-20$ $\mu$m) in y direction is calculated. These amounts of shift $\Delta$x and $\Delta$y may be predetermined minute amounts. The main control device 50 controls the motors 5 and 6 and determines the position of the stage 3 so that the position of the stage 3 measured by the laser interferometers 9 and 10 coincides with the calculated offset position (Ax+$\Delta$x, Ay+$\Delta$y).

At step 108, the projected image of the reticle R1 is superposition-exposed as the second print onto the wafer WA. At step 109, whether [$C_1$] is N is judged and, if [$C_1$]≠N, the program shifts to step 110 and [$C_1$] is incremented by 1. The above-described operation is performed with respect to each pattern area of the wafer WA by steps 106–110, and exposure is effected with the superposed position of the projected image of the reticle R1 being shifted by $\Delta x$ and $\Delta y$ by the step and repeat system. At step 111, the wafer WA which has been exposed is carried to the device 62 by the carrying device 61 and developed in the device 62, whereby the resist pattern of the reticle R1 transferred by the second print is formed. At this time, on the wafer WA, diffraction grating marks $KX_2$ and $KY_2$ corresponding the marks KX and KY, respectively, on the reticle R1 are formed in respective pattern areas. It is to be understood here that the mark $KX_2$ deviates by $\Delta x'$ in x direction relative to the previously formed mark $KX_1$ and that the mark $KY_2$ deviates by $\Delta y'$ in y direction relative to the previously formed mark $KY_1$.

The wafer WA on which such a resist pattern has been formed is again set at a predetermined position on the holder 2 at step 112, and global alignment is effected, as at steps 103 and 104.

At step 113, the content [$C_2$] of the internal counter $C_2$ of the control device 50 is set to 1. At step 114, the operation shown below is performed with respect to the pattern area indicated by the value of [$C_2$].

At step 114, the main control device 50 moves the stage 3 and scans the light spot LXS of the X-LSA system and the marks $KX_1$ and $KX_2$ relative to one another, and introduces intensity distribution wave forms in x direction of the diffracted light from the marks $KX_1$ and $KX_2$. The spacing $\Delta x'$ in x direction between the two marks $KX_1$ and $KX_2$ is calculated from the intensity distribution wave forms. Likewise, the spacing $\Delta y'$ in y direction between the two marks $KY_1$ and $KY_2$ is calculated by the use of the Y-LSA system.

Next, as shown and step 115, the main control device 50 finds the absolute values $|\Delta x - \Delta x'|$ and $|\Delta y - \Delta y'|$ of the deviations between the design amounts of shift $\Delta x$ and $\Delta y$ and the spacings $\Delta x'$ and $\Delta y'$ as the actually measured values and memorizes them in the internal memory thereof. These deviations are the superposition accuracy (or the alignment accuracy) during superposition exposure. This accuracy is memorized in the internal memory of the main control device 50 and used as the supervision data during the actual manufacture of semiconductive elements. At step 116, whether [$C_2$] is N is judged, and at step 117, [$C_2$] is incremented by 1.

In the present embodiment, as described above, a pair of marks KX and KY alone is provided on the reticle $R_1$ near the center thereof, but if the pair of marks KX and KY is provided at a plurality of locations in the pattern area PA, the superposition accuracies at a number of points in a pattern area PA' on the wafer WA can be measured and the distortion of the projection lens 1 can be detected from the difference between the accuracies at the various points in the area PA'. At step 118, the $\delta$ value which is the average deviation is found from the superposition accuracy with respect to each of a plurality of pattern areas on the wafer WA. The light source 64 (FIG. 4) is provided on the side opposite to the lens 1 with respect to the reticle R and the shutter 63 is disposed between the reticle R and the light source 64. In the present embodiment, the image of the reticle has been exposed on a plurality of areas of the wafer, but the present invention also covers a case where the image of the reticle is exposed on one area.

According to the present embodiment, during the first print and the second print, replacement of the reticle is not effected but the reticle remains mounted on the apparatus and therefore, the superposition accuracy attributable to the alignment error including the error of the mark position detection by the X-LSA system and the Y-LSA system and positioning error of the stage 3 can be evaluated. Also, at step 115, the absolute value of the deviation is detected, but the absolute value need not always be taken.

Also, in the present embodiment, the marks MX and MY are detected during the alignment of the wafer WA in the second print, but detection of the accuracy measuring marks KX, and KY, can result in a similar effect. But the marks MX and MY around the pattern area as shown in FIG. 3C are arranged similarly to the mark disposition during the actual manufacture of semiconductive elements and therefore, effecting alignment by detecting the marks MX and MY as in the present embodiment means the representation of the state of alignment during the manufacture of semiconductive elements, and this leads to an advantage that more practical accuracy check can by accomplished.

Further, in the present embodiment, the direction of shift is only one as shown at step 107, but the direction of shift or the amount of shift may be varied for each different area PA' on the wafer WA and superposition exposure may be effected, whereafter the accuracy may be found for each pattern area and the average thereof may be found. The alignment sensor is not limited to the type as shown in the present embodiment, but a similar effect could be obtained by an alignment sensor of any type which belongs to the stepper and can detect the wafer mark. Also, if the alignment sensor is of the stepper type, it can be likewise carried out also in a proximity type x-ray exposure apparatus.

A stepping accuracy examining method according to a second embodiment of the present invention will now be described with reference to the flow chart of FIG. 5. The reticle to be prepared for this examination may be the same as that shown in FIG. 3B in respect of the shapes of the marks, but in this reticle, the transmitting area and the light-intercepting area in FIG. 3B are reversed form each other.

At step 200, the main control device 50 aligns the reticle, and at step 201, it causes the stage 3 to effect stepping on the basis of the data regarding the shot(-chip) arrangement on the wafer WA corresponding to the dimensions of the pattern area PA of the reticle R1, thereby exposing the projected image of the pattern area PA on the wafer WA by the step and repeat system. When the exposure is completed, both of the reticle R1 and the wafer WA are left as they are. Thereby, the latent images of the marks KX and KY are formed in the photoresist. The above-mentioned data will hereinafter be called the arrangement data.

As shown at step 202, the main control device 50 effects an operation for correcting the positions of the shots of the arrangement data used at step 201 by $\Delta x$ and $\Delta y$, respectively, in x and y directions. These amounts of shift $\Delta x$ and $\Delta x$ are predetermined amounts and are memorized in the internal memory of the main control device 50.

Next, at step 203, the main control device 50 causes the stage 3 to effect stepping in accordance with the crrected arrangement data, thereby re-exposing the projected image of the pattern area PA of the reticle R1 on the wafer WA in such a manner that said projected image is superposed on the latent images in the photoresist on the wafer WA. At this time, the marginal portion of the latent images corresponding to the marks KX and KY in each pattern area exposed at step 110 is an unexposed portion and thus, at step 203, the projected images of the marks KX and KY are exposed on this unexposed portion. The processing thereafter is similar to that of step 111 and so on of FIG. 3A.

According to the present embodiment, the alignment accuracy, i.e., the stepping accuracy, of the stage 3 controlled by the laser interferometers 9, 10 and the motors 5, 6 can be examined easily. In the present embodiment, two marks KX and KY are provided in the pattern area PA of the reticle R1, but alternatively, provision may be made of a single grating mark in the form of a cross extending in x direction and y direction.

According to the present invention, as described above, the superposition accuracy of the exposure apparatus and the stepping accuracy of the stage can be self-checked without requiring an expensive examining device and it is not necessary to prepare two reticles for the accuracy examination and therefore, the cost of examination ca be reduced. Further, superposition exposure is effected with only a single reticle being set and thus, any reticle alignment error is essentially excluded and more precise accuracy measurement can be accomplished. The present invention is also applicable to an x-ray exposure apparatus having no projection optical system. Further, in the present embodiment, the marks exposed on the wafer are detected after being developed, but if use is made of photoresist having such a characteristic that the refractive index of light is varied by the application of light, the positions of the marks can be detected without the developing process being carried out.

Figure 6:
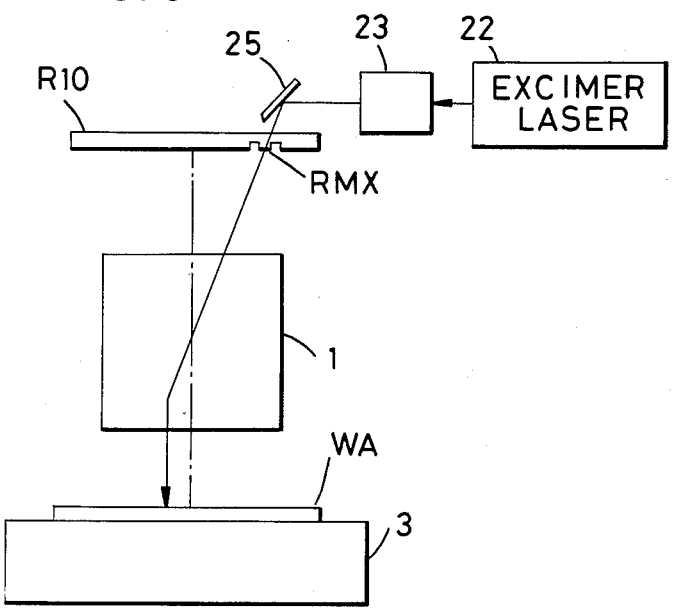
FIG. 6 is a schematic representation of a further embodiement of th present invention.
Figure 9:
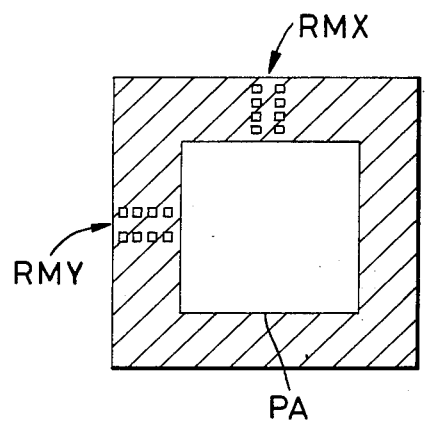
FIG. 9 is a top plan view showing a reticle according to the further embodiement of the present invention.

FIG. 6 is a structural representation of an alignment apparatus showing a further embodiment of the present invention. In the figure, numeral 22 is a hihg energy illumination light source which produces excimer laser light. An irradiation optical system 23 condenses the excimer laser light and irradiates a local area only only o a reticle R10, including a mark RMX, through a mirror 25. Thus an image of alignment mark RMX, formed on the reticle R10 as shown in FIG. 9, is formed on a wafer WA. As in FIG. 1, an XY-stage 3 can be moved exactly by servo-controlling motor 5 to effect a predetermined amount of movmenet based upon positional information in the X direction detection by an interferometer 10.

In FIG. 6, there are shown the mark RMX, the light source 22, the optical system 23 and the mirror 25 each of which is associated with the movement in the X direction of the XY-stage 3. An optical and a mirror, each of which is in asociation with the movement in the Y direction of the XY-stage 3, are omitted. The light source 22 serves both as a light source in assocaition with the movement in the X direciton of the XY-stage 3 and as a source in association with the movmenet in the Y direction.

Figure 10A:
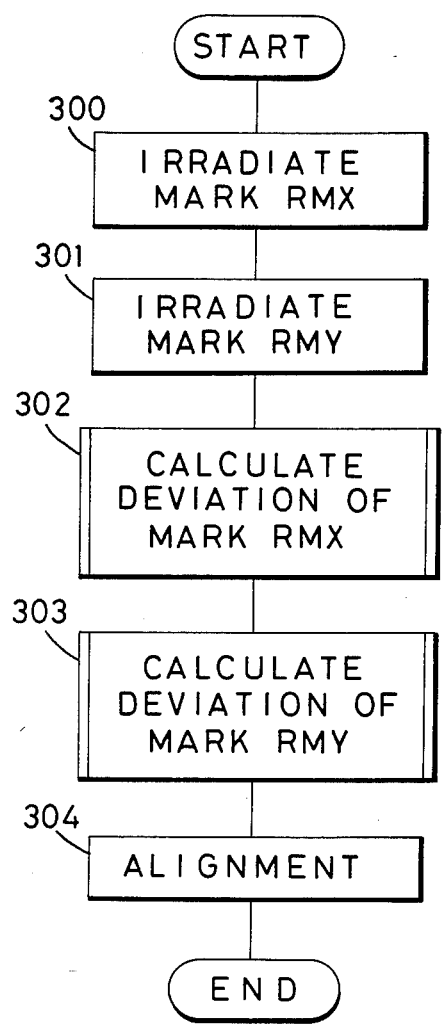
FIGS. 10A and 10B are flow charts showing the operation of the further embodiment of the present invention.

Operation of the further embodiment will now be described with reference to the flow chart of FIG. 10A.

Figure 7A:
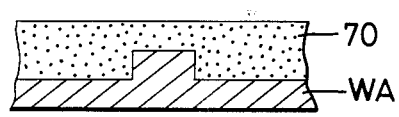
FIGS. 7A, 7B, 7C and 8 show a principle of the further embodiement of the present invention.

At step 300, a predetermined chip (area) within the wafer WA is positioned at a predetermined designed exposure position; the light source 22 is used to project the alignment mark RMX on the reticle RI0 onto the wafer WA; and the wafer is irradiated by excimer laser light to the extent that the alignment mark is etched on a photoresist layer on the surface of the wafer WA, i.e., a part of the photoresist layer is released or evaporated in the shape of the mark RMX. FIGS. 7A, 78 and 7C show the manner of exposure of wafer WA, FIG. 7A showing a sectional view before irradiation, FIG. 7B a sectional view after irradiation, and FIG. 7C a top plan view after irradiation.

Figure 7B:
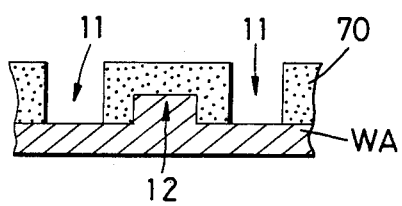
Figure 7C:
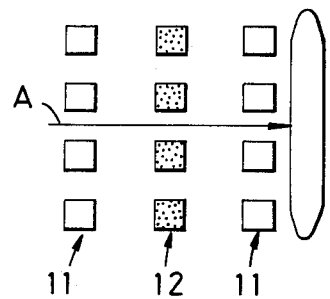

As shown in FIG. 7B, a portion of the photorsist layer corresponding to the projection image of the reticle mark RMX is evaporated by irradiation, producing the shape of two marks 11. Numeral 12 is a mark preformed on the waver WA. When alignment between the reticle R10 and the wafer WA is accurately effected, the position of the mark 12 is so determined that it is in the center between the two marks 11 within the photoresist layer.

Figure 8:
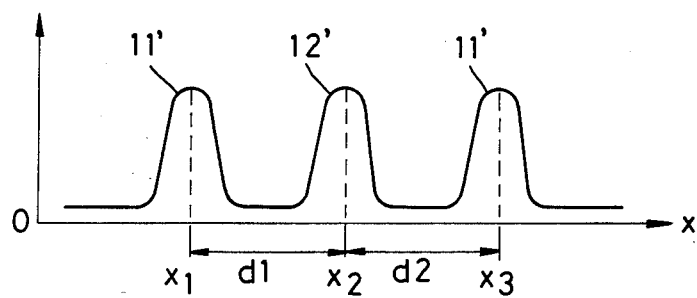
Figure 10B:
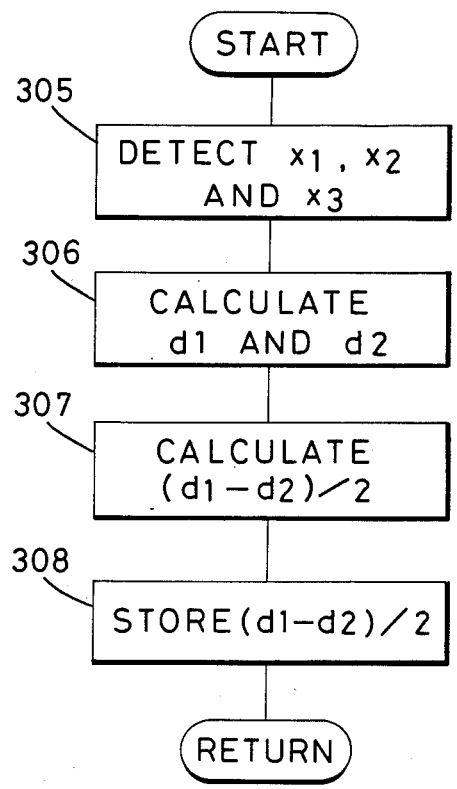

Similarly, at step 301, the stage 3 is moved to a predetermined position, the light source 22 is energized so that a mark RMY is projected on the photoresist layer of the wafer WA and the photoresist layer is evaporated. In succession, at step 302, as shown in FIG. 7C, when the wafer WA formed with the mark 11 and the wafer mark 12 is scanned, for example in the direction of arrow A by moving the XY-stage 3 under light spot LXS (a band-like light spot) of a laser beam from an alignment system which is similar to one shown in FIG. 1, the alignmen,t system detects photoelectric signal waves 11' and 12', shown in FIG. 8, which correspond to the scan positions of the mark 11 and the wafer mark 12, respectively. The light spot LXS is transmitted through the photoresist layer 70. In FIG. 8, an abscissa axis shows the scan position in teh X direction of the XY-stage 3 and an ordinate axis shows levels of the signal. FIG. 10B is a flow chart showing a subroutine at step 302. With the wafer mark 12 forming beforehand incident to the chip area of the wafer WA, and with the mark 11 obtained by light projection at the designed exposure position for a mark on the reticle, coordinates $X_1$, $X_2$ and $X_3$ in the X direction are detected at step 305, and the signal spacings $d_1$ and $d_2$ between $X_1$ and $X_2$, and $X_2$ and $X_3$, respectively, are calculated at step 306, so that a deviation between the mutual positions of the reticle R10 and the wafer WA (which is an alignment error showing superpposition accuracy) is calculated at step 307 by determining $(d_1-d_2)/2$. The calculated result at step 307 is stored in an internal memory of controlling device 50 (FIG. 1) at step 308. If the wafer WA or the reticle RI0 is moved by the amount of deviation $(d_1-d_2)/2$ from the designed exposure position for the purpose of adjusting alignment, superposition of an image of circuit pattenr PA of the reticle R10 through the projection lens 1 and the chip area on the wafer WA is attained. At step 303 processing is effected with respect to a mark RMY in the Y direction as at step 302, and at step 304 the stage 3 is moved depending upon the alignmetn errors in the X direction and in the Y direction which are stored in the internal memory.

The illumination light from the alignment system may be irradiated on the wafer WA from under the reticle R10, rather than through the reticle R10, and a mark detected by moving the XY-stage 3. A separate alignment system may be provided in which illumination light for alignment is irradiated from above the reticle R10 and both a mark on the reticle and a mark on the wafer are detected simultaneously. Instead of moving the XY-staqe, the beam may be scnned at uniform velocity or in a step-wise manner.

If an excimer laser source is used as a light source for exposure, the excimer laser source can also serve as light source 22 for illumination. In addition, instead of the alignment system used in the embodiment of the present invention, a different alignment system may be used in which the mark RMX on the reticle and the mark on the wafer are detected simultaneously through the illumination optical system 23. The light (excimer laser beam) from the light source 22 for illumination to etch the mark RMX in the photoresist layer may be used as illuminating light for alignment. In this case, it is necessary to provide means (for example, ND filter) for making the amount of illuminating light for alignment smaller than that for etching the mark.

We claim:

1. An apparatus having stage means on which a substrate is placed, holding means for holding a mask formed with at least one mark, and exposing means for exposing the image of said at least one mark on the exposure surface of said substrate which is coated with photoresist, said apparatus including:
  (a) displacing means for imparting relative displacement between said stage means and said holding means;
  (b) control means for controlling said exposing means and said displacing means and executing a first exposure and a second exposure successively, said control means executing said first and said second exposure by exposing the image of said at least one mark on a plurality of predetermined areas of the exposure surface of said substrate placed on said stage means, and controlling said exposing means and said displacing means so that the amount of deviation between the position of the image of said at least one mark in each of said plurality of predetermined areas during said first exposure and the position of said image during said second exposure assumes a predetermined value;
  (c) developing means for developing said substrate in response to the termination of said second exposure;
  (d) deviation amount detecting means for detecting the amount of deviation between the position of the image of said at least one mark in each of said plurality of predetermined areas of said developed substrate during said first exposure and the position of said image during said second exposure and producing a detection signal; and
  (e) determining means for determining the accuracy of said apparatus in accordance with said detection signal and said predetermined value.

2. An apparatus according to claim 1, wherein said deviation amount detecting means has position detecting means for detecting the position of the image of said at least one mark in each of said plurality of predetermined areas of said developed substrate during said first exposure and the position of said image during said second exposure and producing a position signal.

3. An apparatus according to claim 2, wherein said developing means develops said substrate in response to the termination of said first exposure and coats said developed substrate with photoresist prior to said second exposure of said developed substrate.

4. An apparatus according to claim 3, wherein said control means controls said displacing means during said second exposure in accordance with said position signal.

5. An apparatus according to claim 1, wherein said determining means calculates the difference between each of the amounts of deviation detected relative to said plurality of predetermined areas by said detecting means and said predetermined value.

6. An apparatus according to claim 5, wherein said determining means calculates the average value of the calculated differences.

7. An apparatus according to claim 1, wherein said deviation amount detecting means includes means for applying light to the substrate placed on said stage means, and means for detecting light information produced from the substrate placed on said stage means in response to the light applied thereto by said light applying means.

8. An apparatus including stage means on which a substrate is placed, holding means for holding a mask, and exposing means for exposing the exposure surface of the substrate placed on said stage means by light transmitted through the mask held by said holding means, said apparatus including:
  (a) displacing means for imparting relative displacement between said stage means and said holding means;
  (b) control means for controlling said exposing means and said displacing means and executing a first exposures and second exposure successively, said control means executing said first and said second exposure by exposing predetermined area of the exposure surface of said substrate placed on said stage means by a light transmitted through said mask, and controlling said exposing means and said displacing means so that the amount of deviation between the position of said light transmitted through said mask in said predetermined area during said first exposure and the position of said light during said second exposure assumes a predetermined value; and
  (c) deviation amount detecting means for detecting, after the termination of said first and said second exposure, the amount of deviation between the position of the light transmitted through said mask in said predetermined area of said substrate during said first exposure and the position of said light during said second exposure and producing a detection signal.

9. An apparatus according to claim 8, further including determining means for determining the accuracy of said apparatus in accordance with said detection signal and said predetermined value.

10. An apparatus according to claim 9, wherein said substrate is coated with photoresist, said apparatus further has developing means for developing said substrate, and said developing means develops said substrate after the termination of said second exposure.

11. An apparatus according to claim 10, wherein said developing means develops said substrate prior to said second exposure and after the termination of said first exposure.

12. An apparatus according to claim 11, wherein said deviation amount detecting means has means for detecting the position, during said first exposure, of the light transmitted through said mask in said predetermined area of said substrate developed prior to said second exposure and producing a position signal, and said control means controls said displacing means in accordance with said position signal.

13. A method of controlling an apparatus having stage means on which a substrate is placed, holding means for holding a mask, and exposing means for exposing the exposure surface of the substrate placed on said stage means by light transmitted through the mask held by said holding means, said method inclduing the steps of:

(a) causing said exposing means to execute a first exposure in which a predetermined area of the exposure surface of said substrate placed on said stage means is exposed by the light transmitted through said mask;

b. imparting relative dispalcement between said stage means and said holding means by a predetermined value;

(c) causing said exposing means to execute, in response to the termination of said relative displacement, a second exposure in which said predetermined area of said substrate placed on said stage means is exposed by the light transmitted through said mask; and (d) detecting the amount of deviation between the position of the light transmitted through said mask in said predetermined area of said substrate during said first exposure and the position of said light during said second exposure.

14. A method accoridng to claim 13, further including the step of determining the accuracy of said apparatus in accordance with said predetermined value and said detected amount of deviation.

15. A method according to claim 13, wherein said step of controlling said second exposure includes the steps of:

detecting, after the termination of said first exposure, the position of the light transmitted through said mask in said predetermined area during said first exposure; and controlling said second exposure in accordance with said detected position and said predetermined value.

16. An apparatus in which a first mark and a circuit pattern on a mask are projected onto a substrate through a projection optical system, the substrate having a second mark thereon an a surface formed with a photoresist layer, said apparatus including:

(a) means for emitting a predetermined radiation for irradiating an area of said mask that includes said first mark, for passing said predetermined radiation through said mask and onto said substrate via said projection opticasl system, and for evaporating a part of said photoresist layer of said substrate, so that a mark corresponding to said first mark is formed on said photoresist layer;

(b) detection means for detecting a positional relation, in a predetemrined direction, of said mark formed on the photoresist layer and said second mark; and (c) displacement means imparting relative displacement between said mask ansd said substrate based upon said detected positional relation.

17. An apparatus in which a circuit pattern of a mask formed with a first mark is projected through a projection optical system onto a substrate provided with a second mark and having a surface formed with a photoresist layer, said apparatus including:

(a) means for emitting a predetermined radiation onto said photoresist layer of said substrate and for forming on said photoresist layer a mark corresponding to said first mark; and (b) detection means for detecting a positional relation of said mark formed on said photoresist layer and said second mark.

18. An apparatus according to claim 17, wherein said first mark is formed on said mask by a member that transmits said predetermined radiation and by a member that does not transmit said predetermined radiation, wherein said radiation emitting means irrasdiates said members and said predetermined radiation passes through said mask and is applied to said substrate through said projection optical system.

19. An apparatus according to claim 17, wherein said detection means detects an amount of a postional deviation of said mark formed on said second mark.

20. An apparatus according to claim I9, further including means providing relative displacement between said mask and said substrate in response to said detected amount of deviation.

21. An apparatus according to claim 17, further including means providing relative displacement between said mask and said substrate in response to said detected positional relation.

* * * * *